US005300452A

United States Patent [19]
Chang et al.

[11] Patent Number: 5,300,452
[45] Date of Patent: Apr. 5, 1994

[54] METHOD OF MANUFACTURING AN OPTOELECTRONIC SEMICONDUCTOR DEVICE

[75] Inventors: Chang V. J. M. Chang; Johannes C. N. Rijpers, both of Eindhoven, Netherlands

[73] Assignee: U.S. Philips Corporation, New York, N.Y.

[21] Appl. No.: 966,797

[22] Filed: Oct. 27, 1992

[30] Foreign Application Priority Data

Dec. 18, 1991 [EP] European Pat. Off. ........ 91203349.5

[51] Int. Cl.$^5$ .............................................. H01L 21/20
[52] U.S. Cl. ..................................... 437/126; 437/133; 437/228; 156/646
[58] Field of Search ............... 437/133, 228, 126; 148/DIG. 51; 156/646, 652, 655

[56] References Cited

U.S. PATENT DOCUMENTS 5,017,511  5/1991  Elkind et al. ...................... 437/228
5,074,955  12/1991  Henry et al. ...................... 437/228

OTHER PUBLICATIONS

Stern et al. in "Reactive ion etching of GaAs and InP using SiCl$_4$" Journal of Vac. Sci. Tech. B(4), Oct./Dec. 1983, pp. 1053–1055.

Primary Examiner—Olik Chaudhuri
Assistant Examiner—Ramamohan Rao Paladugu
Attorney, Agent, or Firm—Ernestine C. Bartlett

[57] ABSTRACT

A method of manufacturing an optoelectronic semiconductor device whereby a surface (1) of a semiconductor (2) built up from a number of layers of semiconductor material (4, 5, 6, 7) grown epitaxially on a semiconductor substrate (3), with a top layer (4) of GaAs adjoining the surface (1) and a subjacent layer (5) comprising InP, in particular made of $(Al_xGa_{1-x})_yIn_{1-y}P$ with $0.5 < x < 0.8$ and $0.4 < y < 0.6$, is provided with an etching mask (8), after which the top layer (4) and the subjacent layer (5) are locally etched in a plasma generated in a gas mixture comprising SiCl$_4$ and Ar. According to the invention, CH$_4$ is added to the gas mixture in which the plasma is generated. This measure leads to the creation of a smooth surface during etching of both layers, and in particular during etching of the layer comprising InP. The walls (10) of the ridge (9) formed in the layers are also smooth and steep.

8 Claims, 1 Drawing Sheet

METHOD OF MANUFACTURING AN OPTOELECTRONIC SEMICONDUCTOR DEVICE

BACKGROUND OF THE INVENTION

The invention relates to a method of manufacturing an optoelectronic semiconductor device whereby a surface of a semiconductor body, which is built up from a number of semiconductor material layers epitaxially grown on a semiconductor substrate with a top layer of GaAs adjoining the surface and a subjacent layer comprising InP, is provided with an etching mask, after which the top layer and the subjacent layer are locally etched away in a plasma which is generated in a gas mixture comprising $SiCl_4$ and Ar.

Such an optoelectronic semiconductor device is, for example, a diode laser. In that case, for example, a layer comprising InP of $(Al_xGa_{1-x})_yIn_{1-y}P$ with a thickness of approximately 1 $\mu$m is present below a top layer of GaAs with a thickness of approximately 0.3 $\mu$m. Below this, furthermore, there is an approximately 0.1 $\mu$m thick layer of $Ga_{0.5}In_{0.5}P$, also called active layer, and an approximately 1 $\mu$m thick layer of $(Al_xGa_{1-x})_yIn_{1-y}P$. The active layer with a refractive index of approximately 3.65 lies enclosed between two layers with a lower refractive index of approximately 3.44 (when $0.5<x<0.8$ and $0.4<y<0.6$). Light with a wavelength of approximately 670 nm generated in the active layer is confined in the active layer in such a layer package. The top layer of GaAs is strongly doped in practice and provided with an electrode. The top layer and the subjacent InP-containing layer are locally etched away, so that a ridge is formed in these layers. The top layer is provided with an electrode. During operation, an electric current is passed through the layers via this electrode, so that light is generated in that portion of the active layer which is situated immediately below the ridge. The ridge is formed in the top layer and the subjacent in the case of a laser. A layer structure designed for this purpose may also be used as a waveguide. In that case, etching is often continued until the ridge also extends into the layer situated below the active layer. Light guided into the active layer is then confined in the active layer, just as in the case of the laser diode.

M. B. Stern and P. F. Liao in "Reactive etching of GaAs and InP using $SiCl_4$", J. Vac. Sci. Technol. B 1 (4), October–December 1983, pp. 1053-1055, disclose a method whereby an etching mask of NiCr is provided on the surface of layers of GaAs and of InP, after which the layers are etched in a plasma generated in a gas mixture comprising $SiCl_4$ and Ar. The addition of Ar to the gas mixture suppresses redeposition of material from the plasma onto the surface to be etched. The addition of Ar moreover results in etched ridges with comparatively steep edges.

It is found in practice that the known etching process is not satisfactory when a ridge as mentioned above is formed in the top layer of GaAs and in the subjacent layer comprising InP. Especially during etching of the layer comprising InP, a very rough surface is created with crests and troughs which are locally equally high as the ridge itself formed in this layer. The walls of the ridge formed in the layer are also rough. An optoelectronic semiconductor device which exhibits the said desired light confinement cannot be realized by the known method described.

SUMMARY OF THE INVENTION

The invention has for its object inter alia to provide a method by which the said disadvantages are counteracted. The method mentioned in the opening paragraph is for this purpose characterized in that $CH_4$ is added to the gas mixture in which the plasma is generated. It is found that a smooth surface is created owing to this measure during etching of both layers, in particular during etching of the layer comprising InP. The walls of the ridge formed in the layers are also smooth and steep. An optoelectronic device is obtained which does exhibit the said desired light confinement as a result of the measure. It is suspected that the roughness of the surface of the etched layer comprising InP is caused by In precipitates when the known described method is used. It is suspected that these precipitates stay behind during etching of the layer comprising InP and then act as masks on a very small scale during etching of this layer. The addition of $CH_4$ to the gas mixture leads to the formation of hydrogen radicals in the plasma which etch away the indium precipitates.

A particularly smooth surface is obtained when, according to the invention, the layer comprising InP is formed by a layer of $(Al_xGa_{1-x})_yIn_{1-y}P$, with $0.5<x<0.8$ and $0.4<y<0.6$. This is true more particularly when 10 to 40 vol. % $CH_4$ is added to the gas mixture in which the plasma is generated. If less than 10 vol. % $CH_4$ is added to the plasma, some roughening of the etched surface often occurs, whereas an undesirable deposition of organic material on the surface takes place if more than 40 vol. % $CH_4$ is added to the gas mixture. Said organic material may inhibit the etching process locally in an uncontrolled manner.

BRIEF DESCRIPTION OF THE DRAWINGS

The invention is explained in more detail below, by way of example, with reference to a drawing and some embodiments. In the drawing.

DETAILED DESCRIPTION OF THE PREFERRED EMBODIMENTS

Figure 1:
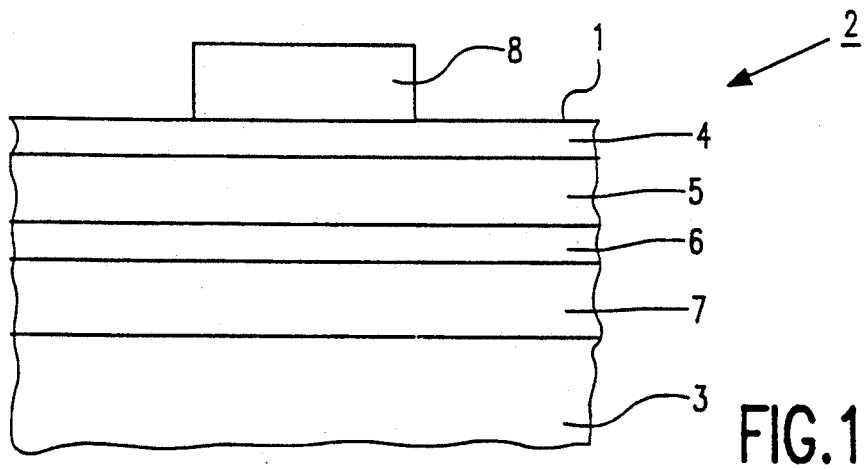
FIGS. 1 to 3 diagrammatically and in cross-section show a few stages in the manufacture of an optoelectronic semiconductor device made by the method according to the invention.
Figure 2:
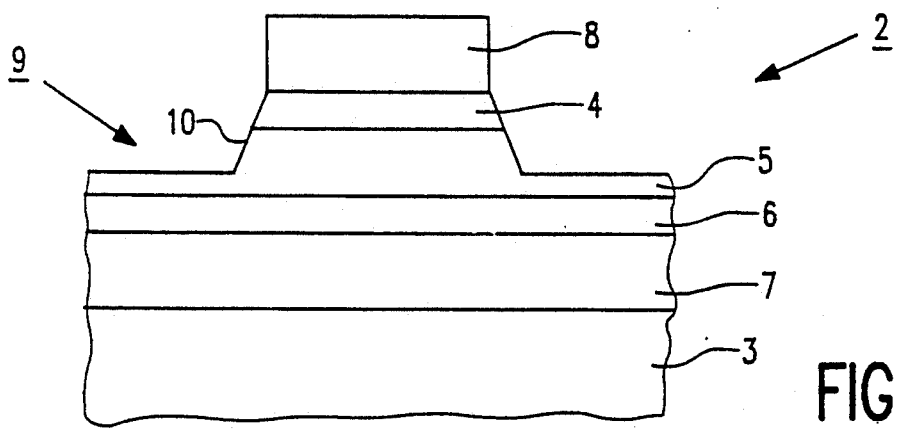
Figure 3:
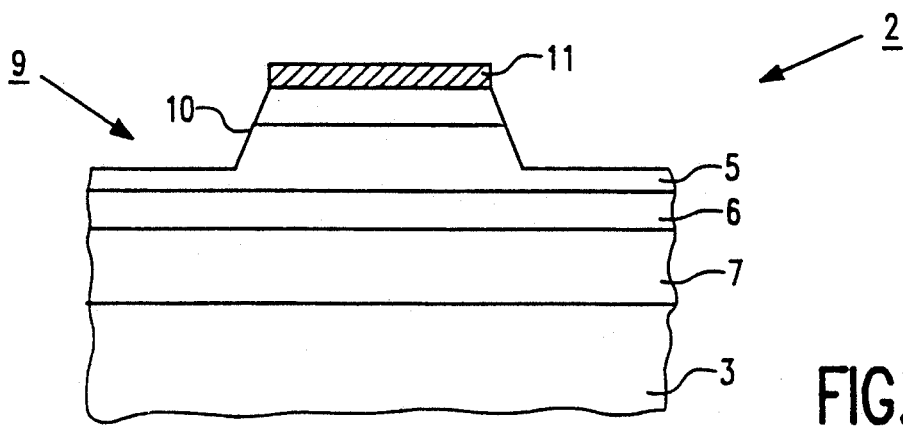

FIGS. 1 to 3 diagrammatically and in cross-section show a few stages in the manufacture of an optoelectronic semiconductor device, in this case a diode laser, whereby a surface 1 of a semiconductor body 2 built up from a number of layers 4, 5, 6, 7 of semiconductor material epitaxially grown on a semiconductor substrate 3, with a top layer 4 of GaAs adjoining the surface and a subjacent layer 5 comprising InP, is provided with an etching mask 8 of photoresist in usual manner.

Below a top layer 4 of GaAs with a p-type doping of $10^{19}$ Zn atoms per cc and a thickness of approximately 0.3 $\mu$m, there is then, for example, a layer 5 comprising InP of $(Al_xGa_{1-x})_yIn_{1-y}P$ with a p-type doping of approximately $3.10^{17}$ atoms per cc and a thickness of approximately 1 $\mu$m. Below this there is an approximately 0.1 $\mu$m thick undoped layer 6 of $Ga_{0.5}In_{0.5}P$, also called active layer, and an approximately 1 $\mu$m thick n-type doped layer 7 of $(Al_xGa_{1-x})_yIn_{1-y}P$. These layers are epitaxially grown on a substrate 3 of n-type doped GaAs in usual manner by means of an MOVPE process.

The active layer 6 with a refractive index of approximately 3.6 lies enclosed between two layers 5 and 7 with a lower refractive index of approximately 3.3 (when $0.5<x<0.8$ and $0.4<y<0.6$). Light with a wavelength of approximately 650 nm which is generated in the active layer remains confined in the active layer 6 in vertical direction.

The top layer 4 and the subjacent layer 5 comprising InP are locally etched away, so that a ridge 9 is formed in the top layer 4 and the subjacent layer 5. After removal of the etching mask 8, the strongly doped top layer 4 of GaAs is provided with a platinum electrode 11 in usual manner. During operation, an electric current is passed through the layers via the electrode 11, so that light is generated in that portion of the active layer 6 which lies immediately below the ridge 9.

Etching of the top layer 4 and the subjacent layer 5 takes place in a plasma generated in a gas mixture comprising $SiCl_4$ and Ar, to which, according to the invention, $CH_4$ is added. It is found that this addition of $CH_4$ leads to the creation of a smooth surface during etching of both layers 4 and 5, and in particular during etching of the layer 5 comprising InP. The walls 10 of the ridge 9 formed in the layers 4 and 5 are also smooth and steep. They enclose an angle of 70° to 80° with the original surface 1 when the semiconductor body 2 is placed on a water-cooled support during etching. Preferably, however, the semiconductor body is heated to a temperature of between 100° and 150° C. during etching. In that case the walls 10 of the ridge 9 enclose an angle of substantially 90° with the original surface 1.

It is achieved through the addition of $CH_4$ to the gas mixture in which the plasma is formed that an optoelectronic device can be realized which exhibits the said desired light confinement. It is suspected that roughness of the surface of the etched layer 5 comprising InP could be caused by In precipitates which stay behind during etching of the layer 5 comprising InP. It is suspected that these precipitates can act as masks on a very small scale during etching of this layer 5. The addition of $CH_4$ to the gas mixture leads to the formation of hydrogen radicals in the plasma, which etch away the indium precipitates.

A particularly smooth surface is obtained when, according to the invention, the layer 5 comprising InP is formed by a layer of $(Al_xGa_{1-x})_yIn_{1-y}P$, with $0.5<x<0.8$ and $0.4<y<0.6$. This is true more particularly when 10 to 40 vol. % $CH_4$ is added to the gas mixture in which the plasma is generated. If less than 10 vol. % $CH_4$ is added to the plasma, some roughening of the etched surface will often still occur, whereas an undesirable deposition of organic material on the surface takes place if more than 40 vol. % $CH_4$ is added to the gas mixture. Said organic material may decelerate etching in an uncontrolled manner.

EXAMPLES:

A semiconductor body as described above with a layer structure comprising an approximately 0.3 μm thick top layer of GaAs with a p-type doping of $10^{19}$ Zn atoms per cc and a subjacent approximately 1 μm thick layer of $(Al_xGa_{1-x})_yIn_{1-y}P$, with $x=0.6$ and $y=0.5$ and a p-type doping of approximately $10^{17}$ atoms per cc, was etched in a plasma generated in a gas mixture with 28 vol. % $SiCl_4$, 22 vol. % $CH_4$, and 50 vol. % Ar. The plasma was generated between two parallel plates arranged at a mutual distance of approximately 7 cm and having a surface area of approximately 200 $cm^2$. The plasma was generated by means of a source supplying a current with a frequency of 13.57 MHz. During etching, an energy of 100 W was dissipated in the plasma. The semiconductor body was positioned on a quartz plate on one of the plates, which was cooled with water during etching. The other plate was made of graphite. A strip-shaped mask with a width of 1.5 μm made of a usual photoresist was provided on the top layer. Etching was stopped after a ridge with a height of approximately 1 μm had been formed. The ridge had plane walls which enclosed an angle of 70° to 80° with the original surface. The etched surface of the $(Al_xGa_{1-x})_yIn_{1-y}P$ layer was smooth.

When the semiconductor body was heated to a temperature of between 100° and 150° C. during etching, the walls 10 of the ridge 9 enclosed an angle of practically 90° with the original surface 1.

Similar good results were obtained in plasmas generated in gas mixtures with i vol. % $SiCl_4$, j vol. % $CH_4$ and 100-i-j vol. % Ar, in which $i=25$ to 30 and $j=20$ to 25.

We claim:

1. A method of manufacturing an optoelectronic semiconductor device whereby a surface of a semiconductor body, which is built up from a number of semiconductor material layers epitaxially grown on a semiconductor substrate with a top layer of GaAs adjoining the surface and a subjacent layer comprising InP, is provided with an etching mask, after which the top layer and the subjacent layer are locally etched away in a plasma which is generated in a gas mixture comprising $SiCl_4$ and Ar, characterized in that $CH_4$ is added to the gas mixture in which the plasma is generated.

2. A method as claimed in claim 1, characterized in that the layer comprising InP is formed by a layer of $(Al_xGa_{1-x})_yIn_{1-y}P$, with $0.5<x<0.8$ and $0.4<y<0.6$.

3. A method as claimed in claim 2, characterized in that 10 to 40 vol. % $CH_4$ is added to the gas mixture in which the plasma is generated.

4. A method as claimed in claim 3, characterized in that the plasma is generated in a gas mixture with i vol. % $SiCl_4$, j vol. % $CH_4$ and 100-i-j vol. % Ar, in which $i=25$ to 30 and $j=20$ to 25.

5. A method as claimed in claim 1, characterized in that the semiconductor body is heated to a temperature of between 100° and 150° C. during etching.

6. A method as claimed in claim 2 wherein the semiconductor body is heated to a temperature of between 100° and 150° C. during etching.

7. A method as claimed in claim 3 wherein the semiconductor body is heated to a temperature of between 100° and 150° C. during etching.

8. A method as claimed in claim 4 wherein the semiconductor body is heated to a temperature of between 100° and 150° C. during etching.

* * * * *